United States Patent [19]
Miller et al.

[11] Patent Number: 5,247,244
[45] Date of Patent: Sep. 21, 1993

[54] ELECTRO-OPTIC VOLTAGE MEASURING SYSTEM WITH TEMPERATURE COMPENSATION

[75] Inventors: Robert C. Miller, New Alexandria; Carlo F. Petronio, Pittsburgh, both of Pa.

[73] Assignee: ABB Power T&D Company Inc., Blue Bell, Pa.

[21] Appl. No.: 524,644

[22] Filed: May 16, 1990

[51] Int. Cl.[5] .................. G01R 33/032; G02F 1/09
[52] U.S. Cl. ........................ 324/96; 324/105; 359/249
[58] Field of Search .............. 324/96, 105, 117 R; 359/246, 249, 86

[56] References Cited

U.S. PATENT DOCUMENTS

| | | | |
|---|---|---|---|
| 4,904,931 | 2/1990 | Miller | 324/96 |
| 5,041,821 | 8/1991 | Onitsuka et al. | 359/86 |
| 5,059,894 | 10/1991 | Miller | 359/246 |
| 5,113,131 | 5/1992 | Cooper et al. | 324/96 |

*Primary Examiner*—Ernest F. Karlsen
*Attorney, Agent, or Firm*—Richard V. Westerhoff

[57] ABSTRACT

As the dielectric constant and the halfwave voltage of electro-optic crystals having a fourfold axis of rotary inversion are oppositely dependent on the absolute temperature, but their product is nearly independent of temperature, temperature compensation in an ac voltage measuring system utilizing such an electro-optic crystal is provided by measuring the time averaged current through the crystal. Good electric isolation is achieved by a current sensing circuit which produces a pulsed light signal having a pulse rate proportional to the time averaged current through the crystal. The pulsed light signal is converted to an electrical signal for input to a digital computer which calculates therefrom, and from a reference current and voltage measured at a reference temperature, and a time averaged voltage measurement, a temperature correction factor which is applied to the crystal halfwave voltage used by the computer in calculating the instantaneous value of the voltage to be measured. A look up table containing empirically derived values related to the calculated correction factor can be used to generate a correction factor adjusted for leakage through the crystal, fringing of the field produced by the voltage to be measured, and residual temperature dependence of the electro-optic crystal. In a practical embodiment of the invention, shield rings surround both ends of the electro-optic crystal to reduce fringing of the electric field.

12 Claims, 3 Drawing Sheets

ELECTRO-OPTIC VOLTAGE MEASURING SYSTEM WITH TEMPERATURE COMPENSATION

Related Application: Commonly owned, concurrently filed United State Patent Application, Appl. No. 524,643, filed May 16, 1990, now U.S. Pat. No. 5,059,894, entitled: "Electro-Optic Voltage Measuring Apparatus with Single Ended Optics".

BACKGROUND OF THE INVENTION

1. Field of the Invention

This invention relates to electro-optic voltage measuring apparatus in which a shift in phase of polarized light passed through a crystal exhibiting birefringence in proportion to an applied electric field provides a measure of the voltage producing the field. More particularly, the invention relates to such apparatus provided with temperature compensation.

2. Background Information

Electro-optical systems for measuring electric voltages are known. For instance, devices known as Pockel cells utilize certain crystals which exhibit birefringence, that is a difference in the index of refraction in two orthogonal planes, in the presence of an electric field. Some of these crystals, such as, for example, KDP (potassium dihydrogen phosphate), have a fourfold axis of rotary inversion. Such materials have the property that in the absence of an electric field the index of refraction for light propagating along the fourfold axis is independent of the plane of polarization of the light. However, if an electric field is applied parallel to the direction of the light, the index of refraction for light polarized in one direction transverse to the fourfold axis, known as the fast axis decreases and that in an orthogonal direction, also transverse to the fourfold axis, and known as the slow axis, increases by an amount which is proportional to the strength of the electric field. In such Pockel cell devices, if light is polarized in a plane which forms an angle to these transverse axes, the component of the polarized light in the direction of the slow axis with the increased index of refraction is retarded with respect to the other component. If the crystal is aligned with its fourfold axis extending between the objects between which the voltage is to be measured is applied, and the polarized light is directed parallel to the fourfold axis, the total retardation will be proportional to the total voltage differential between the two objects. This retardation is typically measured in wavelengths. The retardation is detected in an analyzer and converted to an electrical signal for producing an output representative of the magnitude of the voltage generating the field. Due to the cylic nature of this electrical signal, the output is only unambiguous for voltages producing a retardation which is less than the halfwave voltage for the crystal. In KDP, this halfwave voltage is about 11,300 volts.

U.S. Pat. No. 4,904,931 discloses an electro-optic voltage measuring system in which two beams of polarized light with the fast and slow components of one beam retarded with respect to the corresponding components of the other by an additional ¼ wave over the retardation resulting from the field generated by the applied voltage, are passed through the electro-optic crystal and converted into two electrical signals in quadrature which are used to generate the instantaneous value of an applied voltage of any magnitude.

One application of the voltage measuring system of U.S. Pat. No. 4,904,931 is in measuring the very high voltages present in electric power generation, transmission and distribution systems.

These electro-optic voltage measuring systems have many advantages. They provide good electrical isolation from the voltage being measured. Through the use of optical fibers, it is possible to easily and conveniently provide remote indicators which are not subject to the electrical disturbances which remote indicators fed by electrical signals must contend with.

However, the outputs of electro-optic voltage measuring systems constructed from materials having a fourfold axis of rotary inversion exhibit a temperature coefficient. In some of these materials, such as KDP, the temperature coefficient reaches approximately 0.3 percent per degree centigrade. Such a value of the temperature coefficient precludes the use of these materials in electro-optic voltage measuring systems designed for accurate measurement of voltages without temperature compensation. Even in materials not exhibiting such a high temperature coefficient, temperature compensation can improve the accuracy of the voltage measurement.

It is the primary object of the present invention therefore, to provide an electro-optic voltage measuring system utilizing an electro-optic crystal having improved accuracy.

More particularly, it is an object of the invention to provide such a voltage measuring system with temperature compensation.

It is a further object of the invention to provide such a voltage measuring system which accommodates for leakage and fringing of the electric field produced by the voltage being measured.

SUMMARY OF THE INVENTION

These and other objects are realized by the invention which recognizes that the halfwave voltages of KDP and other high voltage sensitivity electro-optic materials having a fourfold axis of rotary inversion are nearly proportional to the absolute temperature, and that the dielectric constants of these materials are nearly proportional to the reciprocal of the absolute temperature, so that the product of the halfwave voltage and the dielectric constant is nearly independent of temperature. Even for electro-optic materials having lower voltage sensitivities, the product of the halfwave voltage and the dielectric constant is nearly independent of temperature. Thus, in accordance with the invention, the capacitive current through the electro-optic crystal is measured and used in compensating the instantaneous value of the measured voltage calculated from signals derived from the polarized light passed through the electro-optic crystal for variations in temperature.

More particularly, the time averaged current through the electro-optic crystal is measured. By time averaged current, it is meant as used herein, the absolute magnitude of the current through the crystal averaged over time. Preferably, time averaged current signal is an optical signal which provides good electrical isolation. The exemplary circuit, which generates a pulsed optical signal having a pulse rate proportional to the time averaged value of current passing through the electro-optic crystal, includes a diode bridge which converts the ac current to a dc current which charges an integrating capacitor. When the voltage on the capacitor reaches a preset value, a switch means is energized to initiate discharge of the capacitor through a light emitting diode (LED) thereby generating the optical signal. As the voltage on the capacitor decays to a preselected value, a second switch means is turned on which rapidly discharges the capacitor, thereby turning off the LED and resetting the capacitor for recharging.

The optical time averaged current signal is converted to an electrical signal the pulse rate of which is input to a digital computer along with analyzer signals generated from the polarized light passed through the crystal and therefore experiencing a relative phase shift between components parallel to the fast and slow axes of the electro-optic crystal in proportion to the intensity of the electric field generated by the voltage to be measured. The digital computer calculates an instantaneous value of the voltage to be measured from the analyzer signals using the halfwave voltage of the electro-optic crystal. The computer also calculates a time averaged voltage signal from the instantaneous voltage values calculated over time, and utilizes this time averaged voltage signal together with the time averaged current signal and a reference current and voltage signal determined at a given reference temperature to generate a correction factor which is applied to the halfwave voltage used to calculate the instantaneous voltage value.

As a further refinement, empirically generated values of the correction factor which incorporate adjustment for fringing of the electric field around the electro-optic crystal, for leakage current and for any residual temperature dependence of the product of the dielectric constant and the halfwave voltage can be stored in the computer and selected as a function of the calculated correction factor. The effects of fringing are further reduced by shield rings mounted adjacent to and at the same potential as each end of the electro-optic crystal.

BRIEF DESCRIPTION OF THE DRAWINGS

A full understanding of the invention can be gained from the following description of the preferred embodiments when read in junction with the accompanying drawings in which.

DESCRIPTION OF THE PREFERRED EMBODIMENTS

Figure 1:
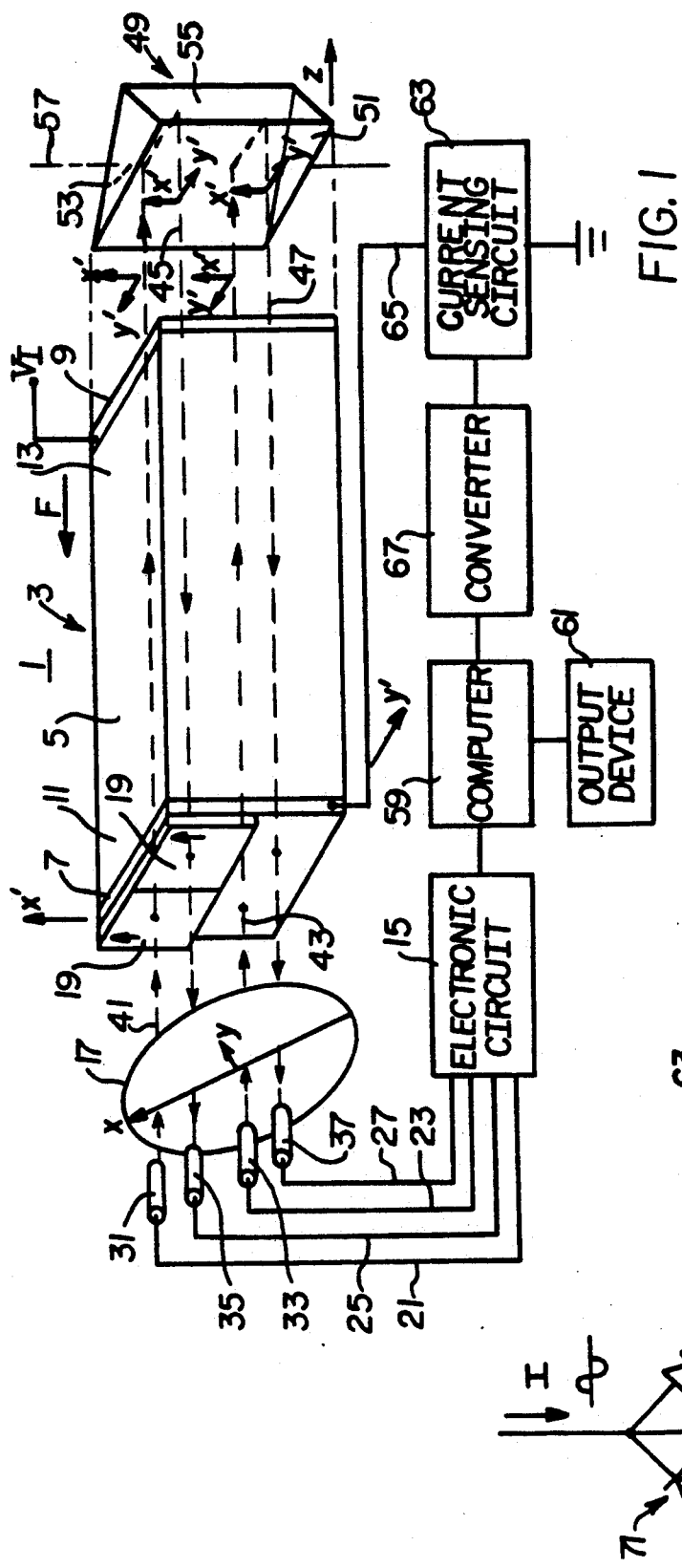
FIG. 1 is a schematic representation of an electro-optic voltage measuring system incorporating the invention.

An electro-optic voltage measuring system 1 incorporating the invention is shown schematically in FIG. 1 to illustrate its operation. The system 1 includes an electro-optic voltage transducer (EOVT) 3 which utilizes an electro-optic crystal 5 having a fourfold axis of rotary inversion. The exemplary transducer 3 utilizes KDP (potassium dyhydrogen phosphate) for the electro-optic crystal 5, however, other materials having a fourfold axis of rotary inversion could alternatively be used. The fourfold axis of rotary inversion of the crystal 5 is oriented parallel to the longitudinal or Z axis as shown in FIG. 1. The ac voltage to be measured is applied to transparent electrodes 7 and 9 at opposite ends 11 and 13, respectively, of the crystal. In the example illustrated, a voltage $V_I$ to ground is shown being measured, however, the potential between any two points such as line to line can be measured by the system. It is preferred, however, that the lower potential such as ground be applied to the electrode 7 as this exposes the input and output connections to the crystal to lower potentials.

The voltage applied across the electrodes 7 and 9 produces a field F which is parallel to the Z axis of the crystal and therefore to the fourfold axis of rotary inversion. The crystal 5 has a fast axis and a slow axis, one of which extends in the direction X' and the other in the direction Y', which are mutually orthogonal to each other and to the fourfold axis of rotary inversion. As is known, the indices of refraction along the X' and Y' axes are equal in the absence of an electric field. However, in the presence of an electric field, the index of refraction and therefore the speed of light in the fast axis, increases while the index of refraction and the speed of light in the direction of the slow axis decreases, each by an amount which is proportional to the strength of the field F. Light passed through the crystal 5 which is polarized along an X or Y axis, each of which is at 45° to both the fast and slow axes of the crystal, will have a component which is parallel to the X' axis and a component parallel to the Y' axis. Thus, one component of the polarized light will be retarded with respect to the other in the presence of an electric field. A measurement of this phase shift provides an indication of the magnitude of a voltage producing the electric field. U.S. Pat. No. 4,904,931 discloses an electro-optic voltage measuring system in which two polarized beams of light are passed through the electro-optic crystal 5. The two polarized light beams are injected into the crystal at one end and analyzed by another polarizer at the opposite end of the crystal. In the referenced related patent application, a reflecting device at the second end of the electro-optic crystal reflects the two light beams back through the crystal so that all of the polarizers and other optical connections to the crystal are made at a single end.

In the exemplary system 1, light generated in an electronic circuit 15 is transmitted through optic fibers 21 and 23 to collimators 31 and 33 which generate collimated beams of light which are projected along the paths 41 and 43, respectively. These two collimated beams of light are polarized in a plane extending along the X axis which is at 45° to the fast and slow axes of the crystal 5 in polarizers identified generally by the reference character 17. The polarized light projected along the path 41 passes through ¼ wave plate 19, the transparent electrode 7 and then through the crystal 5 parallel to the fourfold axis of rotary inversion. The polarized light projected along the path 43 passes through the transparent electrode 7 and the crystal 5.

Polarized light traveling along the paths 41 and 43 emerges from the second end 13 of the crystal 5 passes through the transparent electrode 9 and into the reflecting device 49, which in the exemplary system is a triangular prism. The triangular prism 49 has a base face 51 which faces the electrode 9 and a pair of reflecting faces 53 and 55 which intersect each other at a 90° angle and intersect the base face 51 at 45° angles. The triangular prism 55 is aligned with its longitudinal axis 57 parallel to the X' axis of the crystal 5. As described in the referenced related application, the prism 49 may take other forms.

Light emerging from the crystal 5 along the paths 41 and 43 enters the triangular prism 49 where it is reflected by the reflecting face 53 to reflecting face 55 which reflects the light back along paths 45 and 47, respectively, through the electrode 9, the electro-optic crystal 5, the electrode 7, in the case of the path 45 a second ¼ wave plate 19, and the polarizers 17. Light emerging from the polarizers 17 along the path 45 is collimated in collimator 35 for transmission to the electronic circuit 15 through the optic fiber 25. Similarly, light emerging the polarizers 17 along the path 47 is collimated in collimator 37 and transmitted over the optic fiber 27 to the electronic circuit 15. The component parallel to the slow axis of light traveling along each of the paths 41 and 43 through the crystal 5 is retarded with respect to the component along the fast axis by amount $\Gamma$. While as illustrated in FIG. 1, the reflections by the triangular prism 49 cause a reversal in direction of the components of the two light beams parallel to the Y' axis, the components parallel to the fast axis remain parallel to the fast axis and the components parallel to the slow axis remain parallel to the slow axis so that the component parallel to the slow axis is further retarded with respect to the component parallel to the fast axis by an amount $\Gamma$ as the light passes back through the crystal 5 along the paths 45 and 47. Thus, the total retardation of the slow component with respect to the fast component for each of the two light beams is $2\Gamma$. The two ¼ wave plates 19 through which the one light beam passes have their axes aligned so that the fast and slow components of that beam are retarded ¼ wave length with respect to the corresponding components of the other light beam. The light signals returned to electronic circuit 15 are converted into quadrature electrical signals which are used by the computer 59 to calculate an unambiguous instantaneous value of the voltage $V_I$ for voltages of any magnitude. U.S. Pat. No. 4,904,931 is hereby incorporated by reference in order to provide a complete description of the electronic circuit 15 and the operation of the computer 59 in computing the instantaneous value of the voltage $V_I$. The voltage representation generated by the computer 59 is passed to an output device 61, such as for example, a cathode ray tube or a meter.

As mentioned, KDP has a high temperature coefficient, typically about 0.3% per degree centigrade, which affects the accuracy of the instantaneous value of the voltage generated by the computer 59. As noted, the halfwave voltages of KDP, and other high voltage sensitivity electro-optic materials having a fourfold axis of rotary inversion are nearly proportional to the absolute temperature, and the dielectric constants of these materials are nearly proportional to the reciprocal of the absolute temperature. Thus, the product of the halfwave voltage and the dielectric constant is nearly independent of temperature. This product of the halfwave voltage and the dielectric constant is also nearly independent of temperature for other materials with a fourfold axis of rotary inversion, but with a lower voltage sensitivity. We have determined therefore, that a measurement of the dielectric constant of the electro-optic material forming the crystal 5 can be used to determine variations in the halfwave voltage due to changes in temperature. If the temperature of the electro-optic crystal 5 varies, the average dielectric constant can be used to calculate an effective halfwave voltage which in turn can be used to correctly calculate the instantaneous voltage.

In accordance with the invention, the average dielectric constant of the electro-optic crystal 5 is determined by measuring the time averaged current flowing through the crystal. This time averaged current is measured by a current sensing circuit 63 connected in the lead 65 between the electrode 7 of the EOVT and ground. In the exemplary current sensing circuit, a pulsed light signal having a pulse rate proportional to the magnitude of the time averaged current flowing through the electro-optic crystal 5 is generated. A converter 67 generates from this pulsed light signal a pulsed electrical signal the pulse rate of which is digitized for input into the computer 59.

Figure 2:
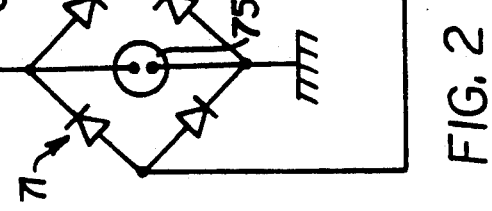
FIG. 2 is a schematic circuit diagram of a current sensing circuit which forms a part of the electro-optic voltage measuring system of FIG. 1.

FIG. 2 discloses a suitable circuit 63 for measurement of the time averaged current through the electro-optic crystal 5 which typically would have an average value in the neighborhood of tens of micro amps for transmission line voltages in the hundreds of KV. The circuit 63 generates the pulsed optical signal having a pulse rate equal to the time averaged current through the electro-optic crystal. A full wave diode bridge circuit 71 converts the ac current through the crystal into a full wave rectified dc signal which charges an integrating capacitor 73. A spark gap device or neon tube 75 protects the current sensing circuit by short circuiting to ground surges which exceed the firing voltage of the spark gap device or neon tube 75.

When the voltage across the capacitor 73 exceeds the breakover voltage of a zener diode 77, and the emitter to base turn on voltage of a transistor 79, the transistor 79 is turned on. Conduction by the transistor 79 turns on a transistor 81. A small resistor 83 connected between the emitter of transistor 79 and capacitor 73 provides a loop gain for the known transistor equivalent of an SCR formed by the transistors 79 and 81 to rapidly drive these transistors into saturation. Resistors 85 and 87 reduce the susceptability of the transistors 79 and 81 to false turn on, and they also affect the loop gain of the transistor SCR equivalent.

With the transistors 79 and 81 turned on, a light emitting diode (LED) 89 is turned on by current discharging from the capacitor 73 and begins emitting infrared light. A small series resistor 91 limits the current through the LED 89. Current discharging from the capacitor 73 also begins charging through a diode 93 the gate to source capacitance of an insulated gate N-channel MOSFET 95. A small resistor 97 in series with the diode 93 sets the charging rate of the MOSFET gate to source capacitance and therefore the turn on time of the MOSFET 95. With the MOSFET 95 turned on, the integrating capacitor 73 is discharged quickly. As the voltage on capacitor 73 drops, the transistor pair 79, 81 is turned off. The charge on the source to gate capacitance of the MOSFET 95 then bleeds through a resistor 99 to turn off the MOSFET 95 and reset the circuit 69 for recharging the integrating capacitor 73. Suitable components for an exemplary average current sensing circuit 69 are as follows:

bridge 71 diodes; 1N4148
capacitor 73; 10 μF
neon bulb 75; NE51
zener diode 77; 1N5533
transistor 79; 2N2222
transistor 81; 2N2907
resistor 83; 75 ohms
resistor 85; 30K
resistor 87; 30K
LED 89; Honeywell HFE 4000 resistor 91; 100 ohms
diode 93; 1N4150
MOSFET 95; 1N660
resistor 97; 10K
resistor 99; 470K The pulsed light signal generated by the current sensing circuit 63 is, as mentioned, detected by the converter 67 where it is converted into a pulsed electrical signal the pulse rate of which is digitized for input into the computer 59.

Figure 3:
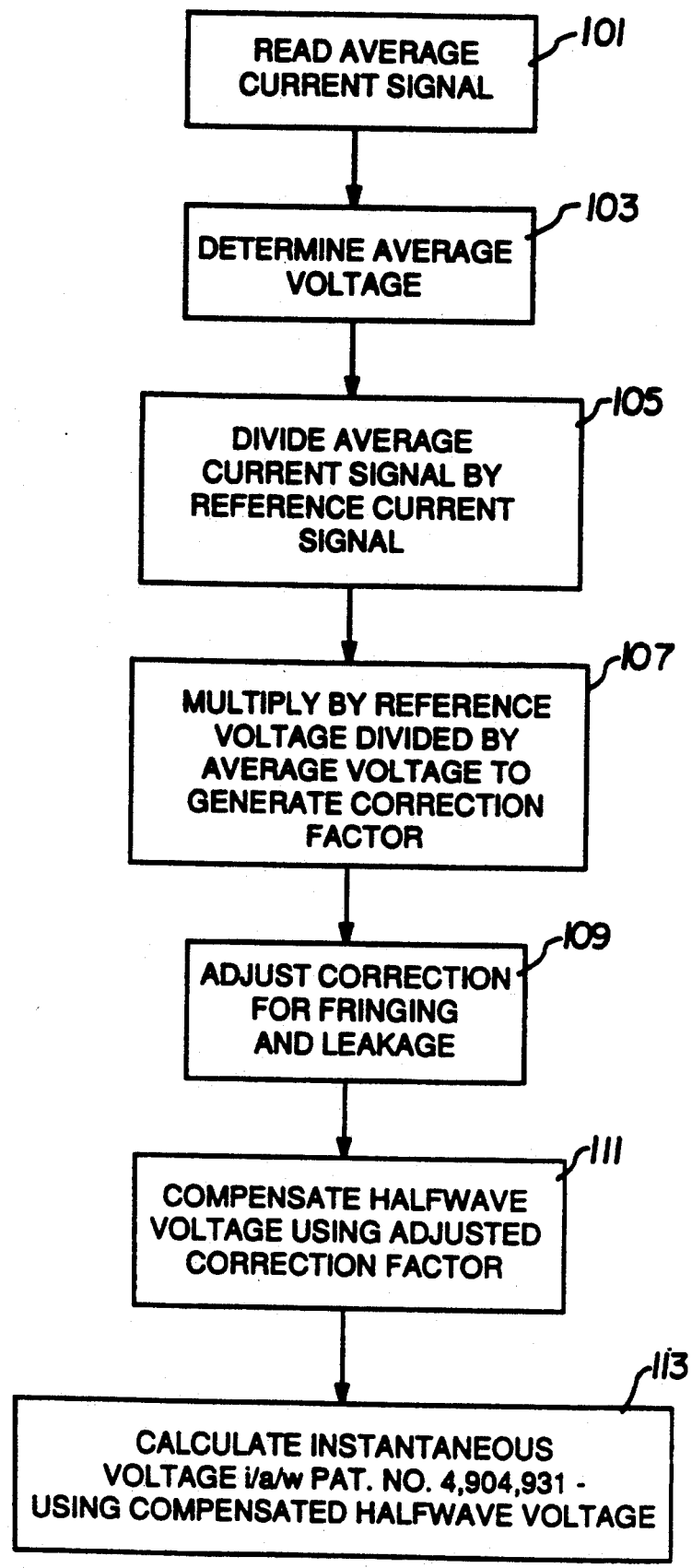
FIG. 3 is a flow chart of a suitable computer program utilized by the electro-optic voltage measuring system of FIG. 1 in implementing the invention.

FIG. 3 is a flow chart for a suitable computer program utilized by the computer 59 to correct the voltage calculation of the instantaneous value of the voltage $V_I$ for temperature effects, and if desired fringing, leakage and residual temperature dependence. As indicated at 101, the pulse time averaged current signal is input from the converter 67. A time averaged voltage signal generated from the instantaneous voltage signals generated by the program is maintained as indicated 103. In calculating the correction factor, the time averaged current signal is divided by the reference current signal as indicated at 105 with the quotient multiplied by the reference voltage divided by the time averaged voltage at 107 to generate the correction factor. This correction factor is adjusted for fringing, leakage and residual temperature dependence in 109 using empirical data stored in a look up table in the computer referenced to the calculated correction factor. The adjusted correction factor is then divided into the halfwave voltage at 111 to generate a compensated halfwave voltage. The routines described in U.S. Pat. No. 4,903,931 are then used to calculate the instantaneous voltage compensated for temperature, and fringing, leakage, and residual temperature dependence using the adjusted compensated halfwave voltage as indicated at 113.

Figure 4:
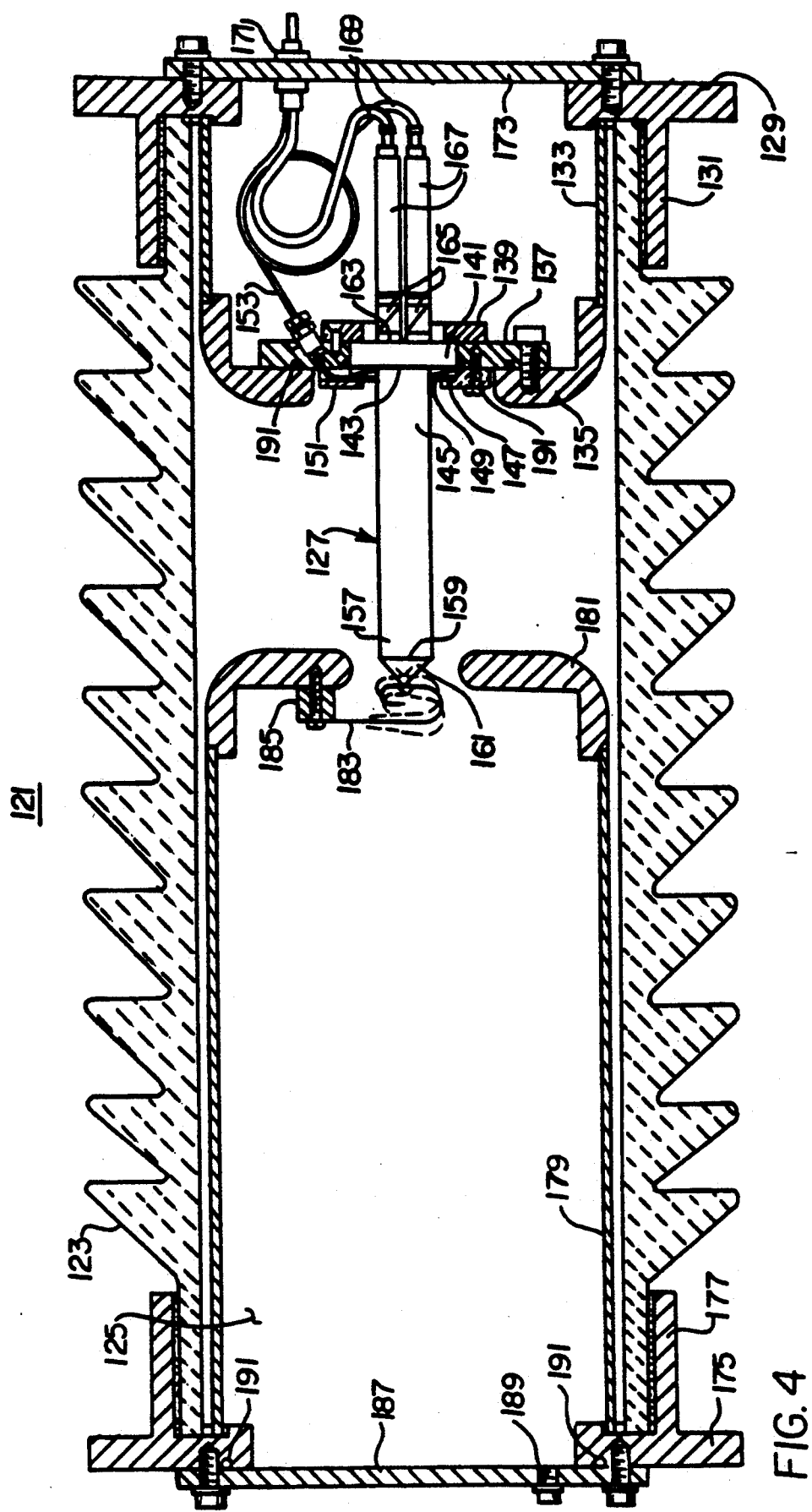
FIG. 4 is a longitudinal sectional view through a practical embodiment of an electro-optic voltage measuring system in accordance with the invention.

FIG. 4 illustrates a practical embodiment of an EOVT 3 in accordance with the invention. The exemplary EOVT 121 includes a cylindrical ceramic insulator 123 which forms a housing having a cavity 125 in which an electro-optic crystal 127 is mounted. An annular end plate 129 has an axially extending cylindrical flange 131 which is cemented to one end of the ceramic insulator 123. A cylindrical, electrically conductive sleeve 133 welded to the end plate 129 extends into the cavity 125 and supports an annular electrically conductive shield ring 135 welded to the sleeve 133. An annular optics base plate 137 is bolted to the shield ring 135 with a smaller annular backing plate 139 concentrically bolted thereto forming a radial flange against which is seated a transparent circular support 141. A coating of indium tin oxide (ITO) 143 on the transparent support 141 forms one electrode for the EOVT 121. One end 145 of the electro-optic crystal 127 is cemented to the ITO layer 143 on the transparent support 141. An electrically conductive wave spring 147 is compressed between the ITO layer 143 and a shim 149 by an annular spring plate 151 which is bolted to the optics base plate 137. An electrical lead 153 is clamped between the spring plate 151 and the shim 149 to provide an electric connection to the ITO electrode 143.

The electro-optic crystal 127 is mounted with its fourfold axis of rotary inversion extending longitudinally along the cavity 125. A second substantially free end 157 of the electro-optic crystal 127 is provided with another electrode layer 159. A reflecting prism 161 is mounted on the substantially free end of the electro-optic crystal 127 by an optical cement.

Cemented by optical glue to the transparent support 141 are fractional wave plates 163, if required, four polarizers 165 (only two visible in FIG. 10), four collimators 167 (two visible) and four optic fibers 169 (again only two visible). Each of the optic fibers 169 passes through a fitting 171 (only one visible) in a cover plate 173 bolted to the end plate 129. The electric lead 153 also passes through a fitting (not shown) in the cover plate 173.

A second annular end plate 175 has an axially extending cylindrical flange 177 which is cemented to the opposite end of the ceramic insulator 123. A second electrically conductive cylindrical sleeve 179 is welded to the annular end plate 175 and extends axially into the cavity 125 to support a second annular shield ring 181 adjacent the substantially free end 157 of the electro-optic crystal 127. An electrically conductive spring 183 bolted to the shield ring 181 with a spacer 185 bears against the reflecting prism 161 which is either partially or fully coated with metal to provide an electrical connection to the upper electrode 159. A second cover plate 187 bolted to the second end plate 175 encloses the cavity 125. Preferably, a high dielectric strength gas such as $SF_6$ is introduced into the cavity 125 such as through a plugged opening 189 in the upper cover plate 187. O-rings 191 between the end plate 175 and cover plate 187, and between optic base plate 137 and shield ring 135 and transparent support 141, seal the cavity 125 to maintain the dielectric gas under pressure to reduce the likelihood of arcing.

By supporting the electro-optic 127 at the one end 145, the crystal is free to expand and contract with temperature variations without being subject to undue mechanical stress. In addition, the shield rings 135 and 181 help to reduce fringing of the field produced by the voltage applied to the electro-optic crystal 127. This voltage to be measured is applied to the upper electrode 159 through the end plate 175, sleeve 179, shield ring 181, spacer 185, spring 183 and the coating on the reflecting prism 161. Voltage on the other electrode 143 is applied through the wave spring 147 shim 149 and electrical lead 153. It is preferred that the lower electrode 143 is connected to the low side of the voltage to be measured. Thus, when a line to ground voltage is to be measured, the electrical lead 153 is connected to ground. The end plate 129 and therefore the sleeve 133 and shield ring 135 are connected to the same potential as the lower electrode 143. With this arrangement, the optical connections are all made in regions of low potential. This reduces the insulation requirements imposed the optic fibers. This advantage is achieved while reducing the mechanical stresses applied to the electro-optic crystal. The lead 153 is connected to the current sensing circuit 63.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the appended claims and any and all equivalents thereof.

What is claimed is:

1. Temperature compensated electro-optic ac voltage measuring apparatus comprising:
    an electro-optic crystal having a dielectric constant which varies with temperature;

means applying a voltage to be measured to first and second ends of said electro-optic crystal;

means measuring current passing through said electro-optic crystal;

means passing polarized light through said crystal; and means analyzing said polarized light emerging from said crystal and generating therefrom and from the measured current passing through said electro-optic crystal an instantaneous value of said voltage to be measured compensated as a function of the measured current passing through said electro-optic crystal.

2. The apparatus of claim 1 wherein said means measuring current passing through said electro-optic crystal comprises means generating a time averaged current signal and wherein said instantaneous value of said voltage to be measured is compensated as a function of said time averaged current signal.

3. The apparatus of claim 2 wherein said means generating said time averaged current signal comprises means generating a pulsed optical signal having a pulse rate proportional to the time averaged value of current passing through said electro-optical crystal.

4. The apparatus of claim 3 wherein said means generating said pulsed optical signal comprises an electrical circuit including an integrating capacitor, a bridge circuit converting ac current flowing through said electro-optic crystal into a dc current which charges said capacitor, a light emitting diode, means responsive to a preset voltage on said capacitor to begin discharging said capacitor through said LED to generate said pulsed optical signal, and means responsive to the voltage on said integrating capacitor decaying to a selected value for rapidly discharging said integrating capacitor to turn off said light emitting diode and initiate recharging of said integrating capacitor.

5. The apparatus of claim 2 wherein said means analyzing said polarized light and generating said instantaneous value of the voltage to be measured includes:

means generating from said polarized light emerging from said electro-optic crystal, an analyzer signal, and calculating means including means generating a time averaged voltage signal from instantaneous values of said voltage to be measured, means generating as a function of said time averaged current signal, said time averaged voltage signal and a stored reference current and reference voltage at a reference temperature, a correction factor, and means generating from said analyzer signal and said correction factor said instantaneous value of said voltage to be measured compensated for temperature.

6. The apparatus of claim 5 wherein said means generating said instantaneous value of said voltage to be measured uses the electro-optic crystal halfwave voltage in calculating said instantaneous value, and wherein said correction factor is applied to said halfwave voltage.

7. The apparatus of claim 6 wherein said means generating said correction factor divides said time averaged current signal by said reference current and multiples the quotient by said time averaged voltage signal divided by said reference voltage.

8. The apparatus of claim 7 wherein said means generating said correction factor includes adjusting the correction factor to a stored empirically generated adjusted value selected as a function of said generated correction factor to accommodate for fringing, leakage and residual temperature dependence.

9. The apparatus of claim 8 including shield rings mounted adjacent said first and second ends of said electro-optic crystal at which said voltage on said adjacent end of the electro-optic crystal is applied.

10. The apparatus of claim 7 wherein said means passing polarized light through said electro-optic crystal includes means passing two beams of polarized light through said electro-optic crystal and wherein said analyzer means generates as said analyzer signal a pair of quadrature electric signals from said two beams of polarized light passed through said electro-optic crystal, and wherein said means generating said instantaneous values of the voltage to be measured utilizes said pair of quadrature electrical signals to generate said instantaneous value.

11. The apparatus of claim 7 wherein said means passing polarized light through said electro-optic crystal passes said polarized light from said first end of said electro-optic crystal to said second end and includes reflecting means at said second end of said electro-optic electro-optic crystal reflecting said polarized light back through said crystal to said first end, wherein said analyzer means includes means at said first end of said electro-optic crystal analyzing polarized light emerging from said crystal and wherein said means measuring current measures the time averaged current through the crystal adjacent said first end of said electro-optic crystal.

12. The apparatus of claim 11 wherein said means passing polarized light through said electro-optic crystal includes means passing two beams of polarized light from said first end of said electro-optic crystal to said second end, wherein said reflecting means at said second end of said electro-optic crystal reflects said two beams of polarized light back through said electro-optic crystal to said first end, and wherein said analyzer means generates as said analyzer signal a pair of quadrature electrical signals from said two beams of polarized light reflected back through said electro-optic crystal, and wherein said means generating said instantaneous value of the voltage to be measured utilizes said pair of quadrature electrical signals to generate said instantaneous value.

* * * * *